United States Patent
Dzung et al.

(10) Patent No.: US 10,056,943 B2
(45) Date of Patent: Aug. 21, 2018

(54) SYSTEM FOR TRANSMITTING AND RECEIVING A POWER LINE COMMUNICATION SIGNAL OVER THE POWER BUS OF A POWER ELECTRONIC CONVERTER

(71) Applicant: ABB Research Ltd., Zurich (CH)

(72) Inventors: Dacfey Dzung, Wettingen (CH); Didier Cottet, Zurich (CH); Simon Douglas Round, Zurich (CH)

(73) Assignee: ABB Research Ltd., Zurich (CH)

(*) Notice: Subject to any disclaimer, the term of this patent is extended or adjusted under 35 U.S.C. 154(b) by 0 days.

(21) Appl. No.: 15/078,410

(22) Filed: Mar. 23, 2016

(65) Prior Publication Data
US 2016/0277071 A1    Sep. 22, 2016

Related U.S. Application Data

(63) Continuation of application No. PCT/EP2014/070390, filed on Sep. 24, 2014.

(30) Foreign Application Priority Data

Sep. 24, 2013 (EP) ..................................... 13185825

(51) Int. Cl.
| | |
|---|---|
| *H04B 3/56* | (2006.01) |
| *H03K 17/605* | (2006.01) |
| *H03K 17/61* | (2006.01) |
| *H02M 7/483* | (2007.01) |
| *H02M 5/458* | (2006.01) |

(Continued)

(52) U.S. Cl.
CPC ............. *H04B 3/56* (2013.01); *H03K 17/605* (2013.01); *H03K 17/61* (2013.01); *H02M 1/088* (2013.01);

(Continued)

(58) Field of Classification Search
CPC ............. H04B 3/542; H04B 3/56; H04B 3/54

(Continued)

(56) References Cited

U.S. PATENT DOCUMENTS

| | | | |
|---|---|---|---|
| 3,942,170 | A | 3/1976 | Whyte |
| 4,065,763 | A | 12/1977 | Whyte et al. |

(Continued)

FOREIGN PATENT DOCUMENTS

| | | |
|---|---|---|
| EP | 1542331 A1 | 6/2005 |
| WO | 2006039823 A2 | 4/2006 |
| WO | 2012143222 A1 | 10/2012 |

OTHER PUBLICATIONS

Kosonen, et al., Ethernet-based broadband power line communication between motor and inverter, IET Electric Power Applications, Oct. 30, 2007, 9 pages.

(Continued)

*Primary Examiner* — David S Huang
(74) *Attorney, Agent, or Firm* — Taft Sterttinius & Hollister LLP; J. Bruce Schelkopf

(57) ABSTRACT

The present application is concerned with a system for transmitting and/or receiving the control and sensing signals between the control units and the power electronic components. One system according to the present application comprises: a transceiver adapted to modulate the communication signal on a communication signal frequency band, and a coupler connected to the power conductor and adapted to couple the modulated communication signal to the power conductor. The present application also concerns a method for transmitting and receiving the control and sensing signals.

14 Claims, 3 Drawing Sheets

(51) Int. Cl.
H02M 1/088 (2006.01)
H02M 1/00 (2006.01)

(52) U.S. Cl.
CPC .. *H02M 5/4585* (2013.01); *H02M 2001/0003* (2013.01); *H02M 2007/4835* (2013.01); *H03K 2217/0081* (2013.01); *H04B 2203/5412* (2013.01); *H04B 2203/5445* (2013.01); *H04B 2203/5466* (2013.01); *H04B 2203/5483* (2013.01); *H04B 2203/5491* (2013.01)

(58) Field of Classification Search
USPC ........................................................ 375/258
See application file for complete search history.

(56) References Cited

U.S. PATENT DOCUMENTS

| | | | | |
|---|---|---|---|---|
| 4,686,382 | A | * | 8/1987 | Shuey ..................... H04B 3/56 307/104 |
| 2002/0027496 | A1 | | 3/2002 | Cern et al. |
| 2003/0046377 | A1 | * | 3/2003 | Daum ..................... H04L 41/18 709/223 |
| 2004/0056734 | A1 | | 3/2004 | Davidow |
| 2006/0108988 | A1 | * | 5/2006 | McKelvey ................ H02J 3/46 323/205 |
| 2008/0224536 | A1 | | 9/2008 | Yamazaki |
| 2009/0256686 | A1 | * | 10/2009 | Abbot .................. G01R 22/063 340/12.32 |
| 2011/0267857 | A1 | | 11/2011 | Fornage |
| 2012/0207138 | A1 | | 8/2012 | Korn et al. |
| 2015/0229358 | A1 | * | 8/2015 | Vrazic .................... H04B 3/542 375/257 |

OTHER PUBLICATIONS

European Search Report, 13185825.0, ABB Research Ltd., dated Feb. 27, 2014.

International Search Report and Written Opinion, PCT/EP2014/070390, ABB Research Ltd., dated May 29, 2015.

* cited by examiner

SYSTEM FOR TRANSMITTING AND RECEIVING A POWER LINE COMMUNICATION SIGNAL OVER THE POWER BUS OF A POWER ELECTRONIC CONVERTER

FIELD OF THE INVENTION

The present invention relates to the field of power electronic converters, in particular to a communication system for exchanging the control and sensing signals between the control units and the power electronic components. The present invention also concerns methods to facilitate such connections.

BACKGROUND OF THE INVENTION

The conventional communication networks in power electronic converters use optical fibres for transmitting power electronic control and sensing signals. When the communication signals are carried on optical fibres, the fast gate control (firing) signals can be reliably transmitted and withstand large voltages.

However, this solution requires a high number of cables and connectors, which leads to high manufacturing costs and makes replacements of power electronic modules cumbersome. Also, ageing of fibres under high voltage stress may be critical.

WO 2006/039823, US 2012/207138 and WO 2012/143222 propose the use of wireless transmission, i.e. radio or free space optical transmission, in PE converters to replace optical cabling.

DESCRIPTION OF THE INVENTION

Alternative communication technologies with simple and space saving structure by using existing components of the power electronic converter are still of interest and the present invention introduces such an alternative.

It is an objective of the invention to provide an alternative solution to the wireless transmission of the communication signal, which overcomes the problems of optical fibres as described before. This objective is achieved by a method and a device according to the independent claims. Preferred embodiments are evident from the dependent patent claims.

The present invention provides a communication system for transmitting and/or receiving a communication signal through a power conductor of a power electronic converter with a plurality of converter modules, comprising a transceiver adapted to modulate the communication signal on a communication signal frequency band, and a coupler connected to the power conductor and adapted to couple the modulated communication signal from or to the power conductor.

The communication signal comprises control and sensing signals between a main controller and a local controller of the power electronic converter. In particular, a main controller of the power electronic converter sends the control signal to the local controller of the converter, and receives the sensing signal from the local controller. The main controller may be also called converter control unit while the local controller may be called switch control unit on a converter module of the power electronic converter.

According to the present invention, the communication signal is transmitted through the conductor of the power electronic converter, i.e. within the power electronic converter rather than on cable used for distribution of electronic power to remote electric appliances. In other words, the present invention does not aim at providing a solution based on power line communication as such but solution of using conductors of the power electronic converters. Hence, the modules within the power electronic converter can be controlled.

The term "modulate" comprises the meaning of modulating the communication signal when the transceiver acts as a transmitter, and the meaning of demodulating the communication signal when the transceiver acts as a receiver. Similarly, the term "couple" comprises the meaning of coupling the modulated communication signal to the power conductor when the transceiver acts as a transmitter, and the meaning of decoupling of the communication signal to be demodulated from the power conductor when the transceiver acts as a receiver.

According to a further aspect, the present invention provides a power electronic converter comprising: a power conductor, a plurality of converter modules, and plurality of the above described communication systems connected with the converter modules for transmitting and/or receiving the communication signal through or via the power conductor.

According to a further aspect, the present invention provides a method for transmitting and/or receiving a communication signal between a main controller and a local controller of a power electronic converter with a plurality of converter modules. The method comprises the steps of: modulating the communication signal, by a transceiver, on a communication signal frequency band, coupling the modulated communication signal to or from a power conductor of the power electronic converter, and transmitting or receiving the communication signal via the power conductor of the power electronic converter. The main controller may both transmit and receive signal from local controller, and local controller may both receive and transmit signal to main controller.

In particular, in case that the transceiver acts as a transmitter, the method is for transmitting the communication signal of the power electronic converter with a plurality of converter modules, and comprises the steps of: modulating the communication signal, by a transceiver, on a communication signal frequency band; coupling, by the coupler, the modulated communication signal to a power conductor of the power electronic converter. In case that the transceiver acts as a receiver, the method is for receiving the communication signal of the power electronic converter with a plurality of converter modules, and comprises the steps of: decoupling, by the coupler, the demodulated communication signal from the power conductor; and demodulating the communication signal, by a transceiver, on the communication signal frequency band.

Preferably, the coupler comprises a capacitive coupler or an inductive coupler. The couple may comprises more than one capacitive or indicative coupler. With more than one coupler, the system enables multiple redundant transmission and reception of the communication signals.

Preferably, the communication signal is modulated on the communication signal frequency band that is different to the frequency band of the power waveform.

Preferably, the system further comprises: a high frequency bypass connected in parallel to a power electronic switch of the power electronic converter, and adapted to the communication signal frequency band.

The present invention takes advantage of using the existing electric power buses for transmission of the control and sensing signal, thereby, saving a separate communication network for carrying these signals.

BRIEF DESCRIPTION OF THE DRAWINGS

The subject-matter of the present invention will be explained in more detail in the following text with reference to preferred exemplary embodiments which are illustrated in the attached drawings, in which.

The reference symbols used in the drawings, and their primary meanings, are listed in summary form in the list of designations. In principle, identical parts are provided with the same reference symbols in the figures.

DETAILED DESCRIPTION OF PREFERRED EMBODIMENTS

Figure 1:
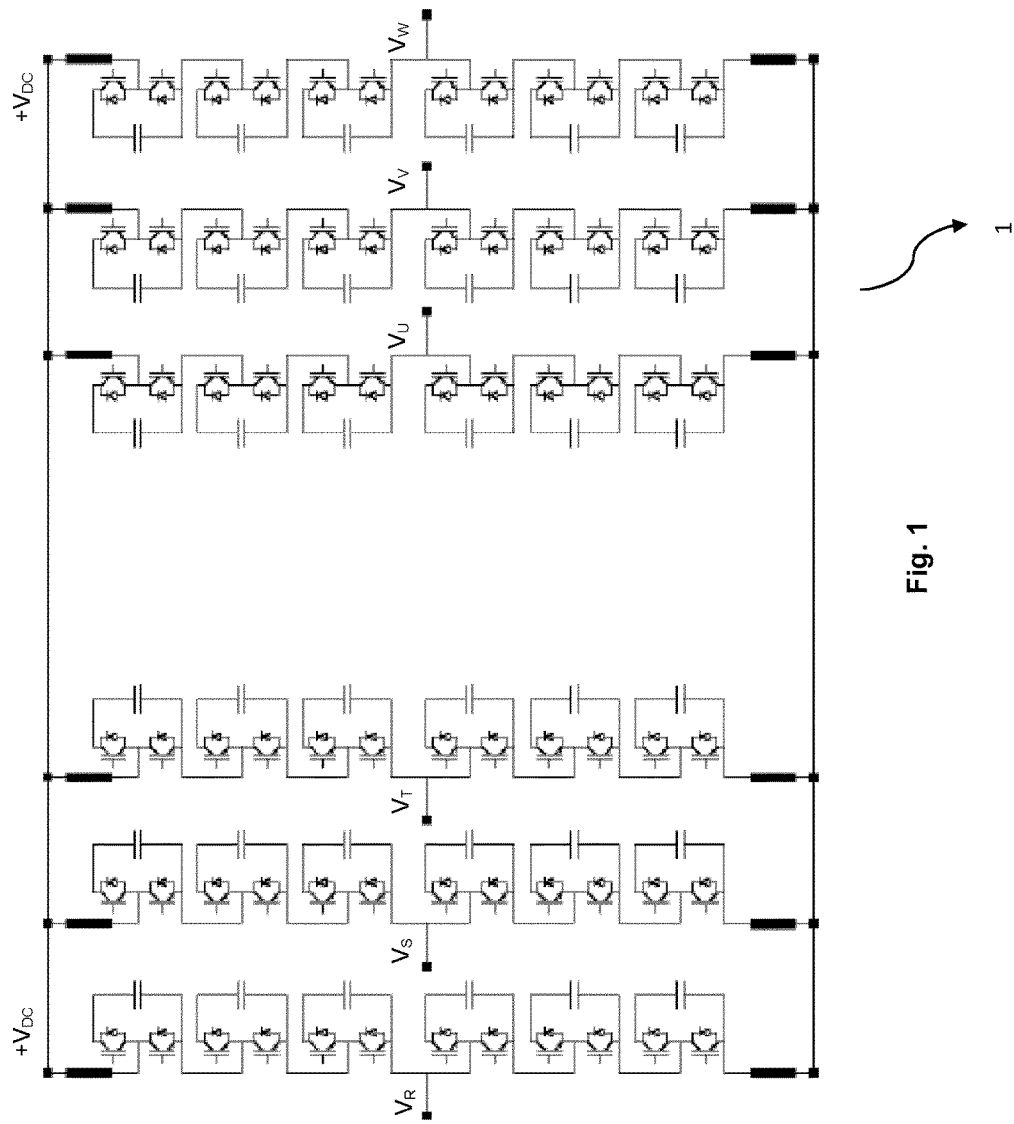
FIG. 1 schematically shows a typical topology of an AC-DC-AC modular multilevel electronic power converter.

FIG. 1 shows the topology of a typical Power Electronic 1 converter, PE converter. The PE switches, i.e. power semiconductors, control the current flow through the connected power buses. Using appropriate control commands to the switches, the AC power at the input ($V_R$, $V_S$, $V_T$) is converted to another AC power waveform at the output ($V_U$, $V_V$, $V_W$).

Figure 2:
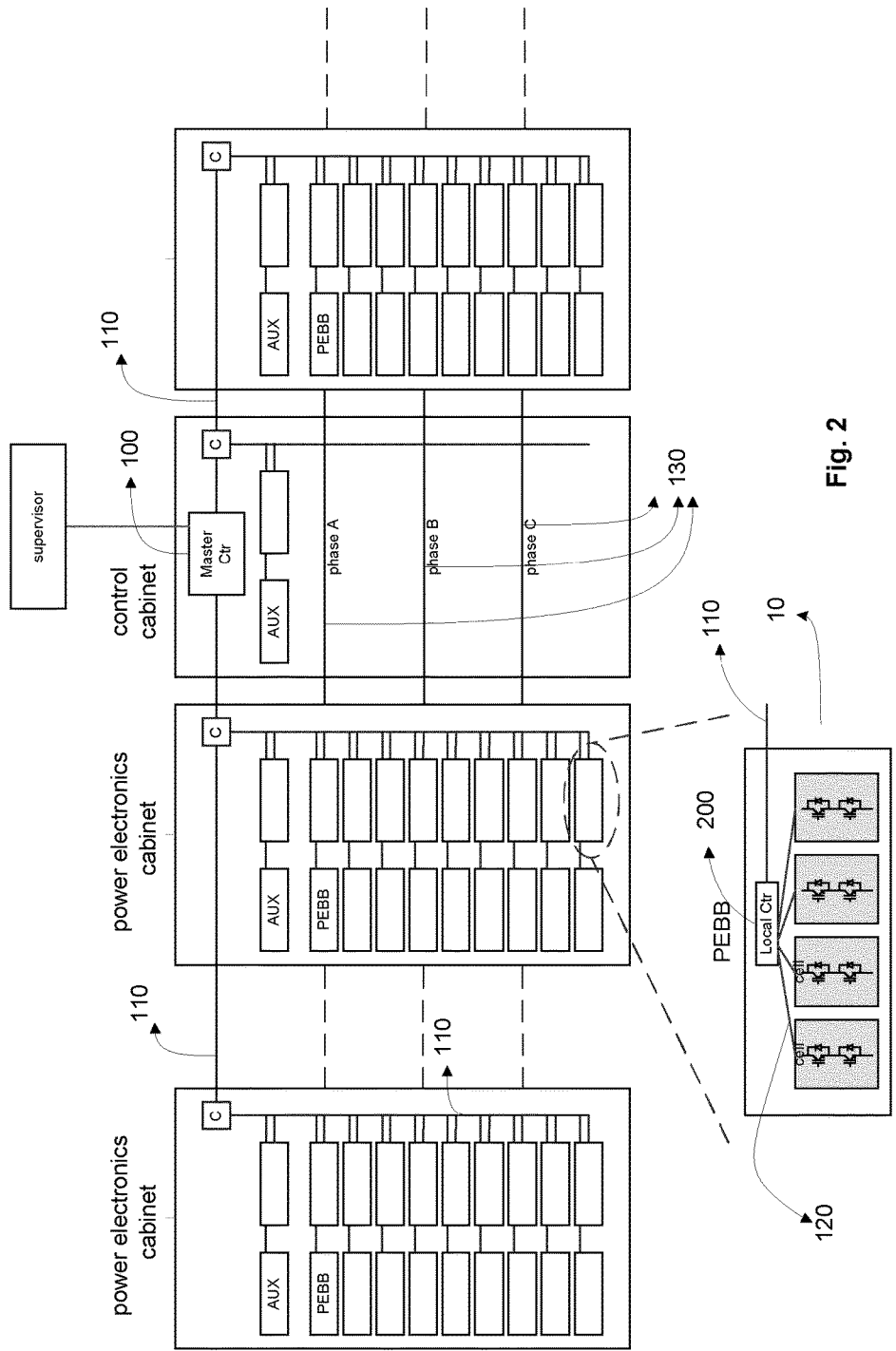
FIG. 2 schematically shows a typical communication architecture of a medium voltage power electronic converter, where the control and sensor signals are exchanged between the main controller and the local controllers.

The control and communication infrastructure generates and transmits the control signals, e.g. gate signals, to the PE switches. FIG. 2 shows such communication architecture. The control and sensor signals are exchanged between a main controller 100 and local controllers 200 located in different cabinets over the communication network 110. A local controller 200 together with a number of PE switches make up a Power Electronic Building Block, PEBB. The local connections within a PEBB from the local controller to its PE switches use electrical or optical wires 120.

The present invention takes advantage of the fact that the PE switches 50 in a PE converter are connected to electric power buses, which carry the electric currents to be switched, see FIG. 1. The communication to the distributed control units, i.e. local controller, LCs, associated to the PE switches may thus utilize these power buses as the communication medium, using power line communication.

Figure 3:
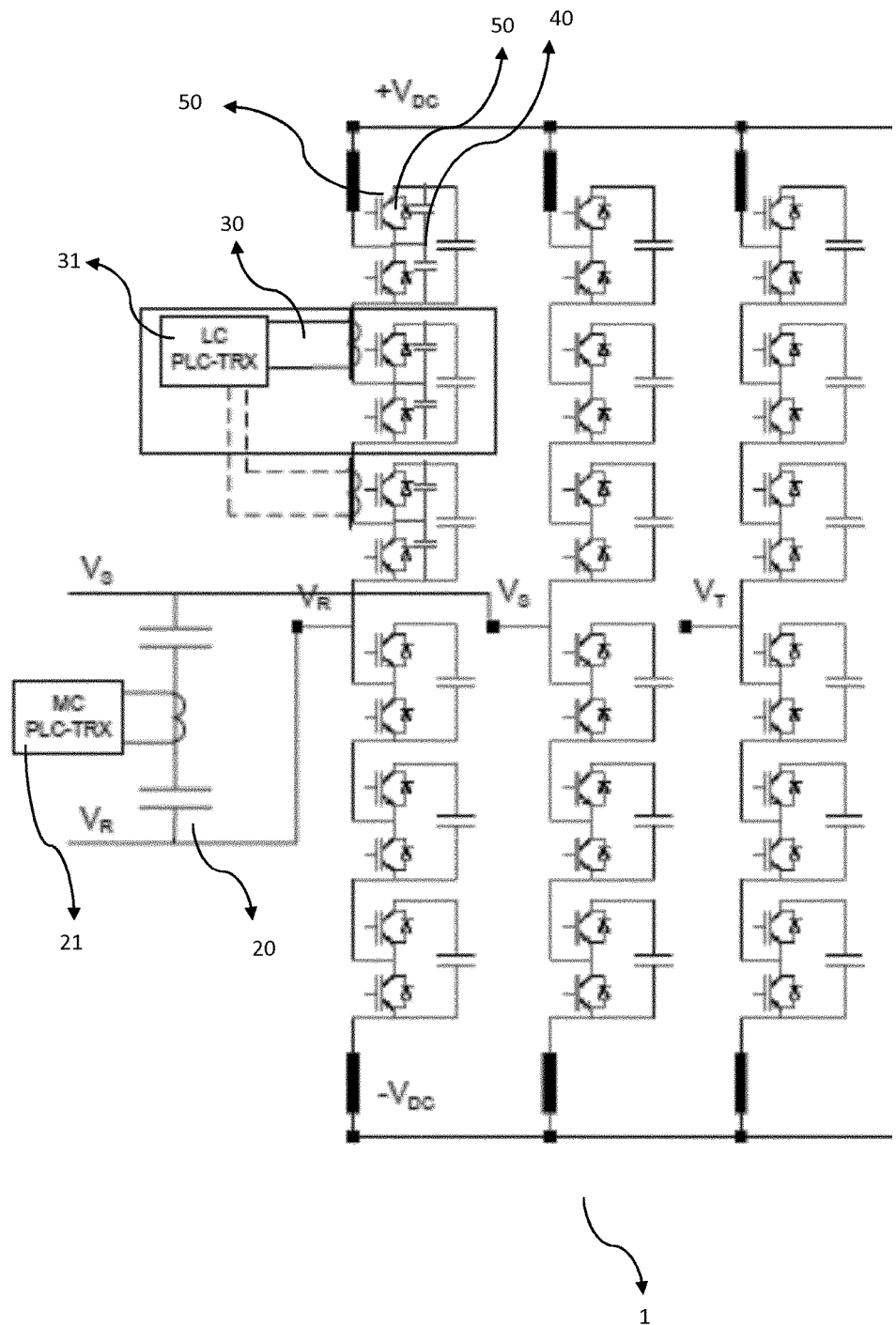
FIG. 3 schematically shows power line communication, PLC, in a PE converter according to the present invention, in which the PLC transceivers, PLC-TRX, capacitive and inductive couplings, and high frequency gate bypass are shown.

FIG. 3 shows that the power line communication transceivers couple their communication signals to and from the power buses, according to the present invention. The power bus serves as a communication medium carrying the control and sensor signals in the form of PLC signals, as well as the (AC) power. To minimize interference from the power waveform, with strong harmonics at up to several kHz, PLC signals are modulated to a different frequency band, e.g. of tens of kHz to tens of MHz, and can thus be separated from the power waveform by band-pass or high-pass filtering. The PLC signals have much lower power, of mV to several Volts peak, than the power waveform. In other words, the modulated PLC signals will be transmitted by the electronic couplers having band-pass or high-pass filter characteristic.

The power line signal coupling may be either capacitive or inductive. As an example, the main controller, MC PLC-TRX, 21 is shown with capacitive coupling between the power buses of phases R and S. The capacitive coupling has in general better performance than inductive coupling, but requires space for high voltage capacitors and connectors to pairs of cables, i.e. power buses.

With inductive couplers, the PLC signals are coupled transformer-like using wire coils around the power bus. In FIG. 3, a local controller, LC PLC-TRX, 31 is shown with inductive coupling. Inductive couplers may be easier to install, but coupling performance depends on the mechanical arrangements and, if a magnetic transformer core is used, on its ferromagnetic properties, in particular, its non-linearity due to saturation.

The above example describes the case where the master controller uses capacitive coupling and the local controller uses inductive coupling. Any combination of controllers and PLC couplers is possible.

Due to the converter operation, parts of a power branch to which a controller is connected may, in a given period of time determined by the switching states in the converter, be in non-conducting state, i.e. when the switch is temporarily turned off, no current may flow through that section of the bus. This would affect PLC communication. Hence, preferably, depending on the characteristics of the PE switch, a high frequency (HF) bypass 40 for the PLC signals is introduced in parallel to the PE switches, in order to achieve acceptable communication reliability. This is shown in FIG. 3 as capacitors 40. The HF bypass 40 lets the PLC signal bypass the PE switch, irrespective of the state of the PE switch.

In a preferred embodiment, a PLC transceiver may employ more than one coupler connected to different coupling points on the power bus, as shown as an example in FIG. 3 for the LC PLC-TRX 31. This allows multiple redundant transmission and reception of the PLC communication signal. In particular, in what is known as reception diversity, the PLC receiver may select or combine multiple signals received from different couplers for best performance.

To further mitigate interference from the power waveform, the PLC receiver may employ adaptive noise cancelling. That is, if the power waveform is known by the PLC receiver, e.g. from separate measurements or from separate control information, this known interference can be cancelled, i.e. subtracted, from the total received signal. This further improves the quality of the desired received PLC signal.

The high frequency gate bypass may be realized by the inherent stray capacitances of the PE switch, typically flat silicon semiconductor chips or wafers. Thus, no additional circuitry is required. This depends on the high frequency impedance of the PE devices.

Where receive-only nodes suffice, e.g. in the case where local controllers are designed such they only need to receive control information and do not need to transmit any data, PLC receiver coupling may employ the principle of the Fibre Optic Current Sensor, FOCS. Such FOCS coupling may facilitate PLC installation in a PE converter considerably. However, accuracy and high frequency performance of such FOCS couplers should be designed accordingly.

According to a further aspect of the present invention, the PLC couplers should fit the available space and mechanical arrangements. High interference from the PE operation may affect the reliability of PLC transmission. The data rate supported by the PLC communication depends on the impedance properties of the power bus at high frequencies, and on EMC restrictions on emissions.

While the invention has been described in detail in the drawings and foregoing description, such description is to be considered illustrative or exemplary and not restrictive. Variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage, specifically, in addition to the actual claim dependency, any further meaningful claim combination shall be considered disclosed.

The invention claimed is:

1. A system for transmitting and/or receiving a communication signal via a power conductor of a power electronic converter with a plurality of converter modules, wherein the communication signal comprises control signals, including gate signals, and sensing signals between a main controller and a local controller of the power electronic converter, wherein the main controller sends the control signals to the local controller, and wherein the main controller receives the sensing signals from the local controller, the system comprising:
 a transceiver adapted to modulate the communication signal on a communication signal frequency hand, and
 a coupler connected to the power conductor and adapted to couple the modulated communication signal to or from the power conductor of the power electronic converter, thereby exchanging said control and sensing signals between said main and local controllers of the power electronic converter.

2. The system according to claim 1, wherein the coupler comprises a capacitive coupler and/or an inductive coupler.

3. The system according to claim 2, wherein the communication signal frequency band is different to the frequency band of the power waveform.

4. The system according to claim 1, wherein the communication signal frequency band is different to the frequency band of the power waveform.

5. The system according to claim 4, further comprises:
 a high frequency bypass connected in parallel to a power electronic switch of the power electronic converter and adapted to the communication signal frequency band.

6. A power electronic, converter comprising: a power conductor;
 a main controller;
 a local controller;
 a plurality of converter modules; and
 a plurality of systems connected with the converter modules for transmitting and/or receiving a communication signal via the power conductor, wherein the communication signal comprises control signals, including date signals, and sensing signals between the main controller and the local controller of the power electronic converter, wherein the main controller sends the control signals to the local controller, and wherein the main controller receives the sensing signals from the local controller, and wherein each of the plurality of systems comprises:
 a transceiver adapted to modulate the communication signal on a communication signal frequency band; and
 a coupler connected to the power conductor and adapted to couple the modulated communication signal to or from the power conductor of the power electronic converter, thereby exchanging said control and sensing signals between the main controller and the local controller of the power electronic converter.

7. The system according to claim 6, wherein the coupler comprises a capacitive coupler and/or an inductive coupler.

8. The system according to claim 6, wherein the communication signal frequency band is different to the frequency band of the power waveform.

9. The system according to claim 6, further comprises:
 a high frequency bypass connected in parallel to a power electronic switch of the power elect converter and adapted to the communication signal frequency band.

10. A method for transmitting and/or receiving a communication signal comprising control signals, including gate signals, and sensing signals between a main controller and a local controller of a power electronic converter with a plurality of converter modules, comprising:
 modulating the communication signal, by a transceiver, on a communication signal frequency band,
 coupling the modulated communication signal, by coupler, to or from a power conductor of the power electronic converter,
 sending the control signals from the main controller to the local controller via the power conductor of the power electronic converter, and
 receiving, t the main controller, the sensing signals from the local controller.

11. The method according to claim 10, wherein the coupler comprises a capacitive coupler and/or an inductive coupler.

12. The method according to claim 11, wherein the communication signal frequency band is different to the frequency band of the power waveform.

13. The method according to claim 10, wherein the communication signal frequency band is different to the frequency band of the power waveform.

14. The method according to the claim 13, further comprises the step of:
 connecting a high frequency bypass in parallel to a power electronic switch of the power electronic converter, and
 bypassing the communication signal on the communication signal frequency band.

* * * * *